United States Patent
Kuo

(10) Patent No.: US 6,411,146 B1
(45) Date of Patent: Jun. 25, 2002

(54) POWER-OFF PROTECTION CIRCUIT FOR AN LVDS DRIVER

(75) Inventor: James R. Kuo, Cupertino, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/741,938

(22) Filed: Dec. 20, 2000

(51) Int. Cl.[7] ................................................ H03K 3/02

(52) U.S. Cl. ...................................... 327/198; 327/143

(58) Field of Search ................................ 327/112, 108, 327/143, 544, 198, 535, 534; 326/83, 86, 115

(56) References Cited

U.S. PATENT DOCUMENTS

| | | | | |
|---|---|---|---|---|
| 5,546,021 A | * | 8/1996 | Bizuneh et al. | ................ 326/86 |
| 5,602,496 A | * | 2/1997 | Mahmood | ..................... 326/71 |
| 5,880,599 A | * | 3/1999 | Bruno | .......................... 326/56 |
| 6,100,719 A | * | 8/2000 | Graves et al. | ................. 326/86 |

* cited by examiner

Primary Examiner—Tuan T. Lam
Assistant Examiner—Hiep Nguyen
(74) Attorney, Agent, or Firm—Brett A. Hertzberg

(57) ABSTRACT

A power-off protection circuit for an LVDS line-driver eliminates initialization problems in a local LVDS driver circuit that are caused by a remote LVDS river when the local LVDS driver is disabled. The remote LVDS driver may introduce a signal into the substrate of the local LVDS driver when the local LVDS driver is in a power-off mode. A current source in the local LVDS driver couples power from a local power supply node to the local LVDS driver when power is active. A method and protection circuit connects the substrate of the current source to the local power supply when power is active, and decouples the substrate from the local power supply when power is deactivated. The remote LVDS driver cannot cause a false power supply signal in the local LVDS driver since the conduction path is disconnected. A first switching element couples a floating substrate node in the current source to the local power supply when the power is active. A second switching element couples the floating substrate node to a bias line when power is deactivated. The first switching element is deactivated by a rising potential in the floating substrate when the local power supply is in a power-off mode. The rising potential is caused by a signal that is transmitted by the remote LVDS driver. By isolating the floating substrate from the local power, supply, false signals are eliminated and initialization problems are avoided.

20 Claims, 6 Drawing Sheets

POWER-OFF PROTECTION CIRCUIT FOR AN LVDS DRIVER

FIELD OF THE INVENTION

The present invention relates to a method and apparatus for protecting a low voltage differential signal (hereinafter referred to as LVDS) driver when a power-off condition occurs. More specifically, the present invention provides for a method and apparatus that prevents a local LVDS port from being incorrectly initialized, and thereby prevents the receipt of false signals in a remote LVDS port from the local LVDS port.

BACKGROUND OF THE INVENTION

Low Voltage Differential Signaling (hereinafter referred to as LVDS) is a technology used in data transmission systems. A low voltage differential signal produced by a line driver typically has peak-to-peak amplitudes in the range from 250 mV to 450 mV. The low voltage swing minimizes power dissipation, while maintaining high transmission speeds. Typical transmission speeds are over 100 Mbps (Mega-bits per second).

Electronic devices (i.e. computers) often have a local port that is a connection terminal for a remote port. When a remote port is connected to the local port, the local port is initialized to recognize the remote port. After initialization, the remote port and the local port can exchange information. The communication between the ports is often done by means of LVDS driver and receiver pairs.

Portable electronic devices such as cell telephones, personal data assistants (PDAs), and portable computers are commonly used in modern society. Since power is in a limited supply in such portable electronic devices, it is often necessary to periodically shut down the power used by various resources until it is needed. For example, hard disk drives are often powered down in portable computers until needed in an effort to reduce overall power consumption.

SUMMARY OF THE INVENTION

In accordance with the invention, an apparatus and method for protecting an LVDS line-driver when power is deactivated solves the above and other problems. A power-off protection circuit for an LVDS line-driver eliminates initialization problems in a local LVDS driver circuit that are caused by a remote LVDS driver when the local LVDS driver is disabled. The remote LVDS driver may introduce a signal into the substrate of the local LVDS driver when the local LVDS driver is in a power-off mode. A current source in the local LVDS driver couples power from a local power supply node to the local LVDS driver when power is active. A method and protection circuit connects the substrate of the current source to the local power supply when power is active, and decouples the substrate from the local power supply when power is deactivated. The remote LVDS driver cannot cause a false power supply signal in the local LVDS driver since the conduction path is disconnected. A first switching element couples a floating substrate node in the current source to the local power supply when the power is active. A second switching element couples the floating substrate node to a bias line when power is deactivated. The first switching element is deactivated by a rising potential in the floating substrate when the local power supply is in a power-off mode. The rising potential is caused by a signal that is transmitted by the remote LVDS driver. By isolating the floating substrate from the local power supply, false signals are eliminated and initialization problems are avoided.

In accordance with an aspect of the invention, a line-driver with a power-down protector that is active when power is disconnected from the line-driver includes a switching circuit that disconnects a conduction path in the line-driver when active, and a detector that determines when the line-driver is in a power-down mode and activates the switching circuit wherein the conduction path in the line-driver is disconnected from power such that false signals are disabled from transmission by the line-driver. The line-driver may be a low voltage differential signaling driver (LVDS driver).

In accordance with a further aspect of the invention, the line-driver includes a first transistor that is biased as a current source in a power-on mode and disabled in the power-down mode such that the first transistor provides the conduction path from power to the line-driver when power is connected to the line-driver. When the first transistor is a field-effect transistor, the gate terminal of the first transistor is coupled to the bulk terminal of the first transistor in the power-down mode. The gate terminal of the first transistor is coupled to a bias potential, and the bulk and source terminals of the first transistor are coupled together in the power-on mode. Also, the switching circuit may include a second transistor that is arranged to couple the gate terminal and the bulk terminal of the first transistor together when active. The switching circuit may also include a third transistor that is arranged to couple the bulk terminal of the first transistor to a local power supply when active. In another embodiment of the invention, the detector circuit includes the switching circuit.

In accordance with yet a further aspect of the invention, the detector circuit is arranged to enable the switching circuit in response to an output signal that approaches a local power supply terminal while power is disconnected from the local power supply terminal. In one embodiment of the invention, the detector circuit includes a first transistor that is arranged to couple the local power supply terminal to a floating substrate node when active, and a second transistor that is arranged to activate the first transistor when the local power supply is coupled to power. In another embodiment of the invention, the detector circuit includes a first transistor that is arranged to decouple a floating substrate node from the local power supply node when active, and a second transistor that is arranged to activate the first transistor when the local power supply is decoupled from power. The line-driver may include a second transistor that is a field effect transistor that is biased as a current source in a power-on mode and disabled in the power-down mode such that the second transistor provides the conduction path from power to the line driver when power is connected to the line-driver, and the floating substrate node is coupled to the bulk terminal of the second transistor. A third transistor may be arranged to activate as the local power supply node discharges towards a circuit ground when the power is disabled, and also arranged to deactivate the first transistor when the output signal increases towards the local power supply node.

In accordance with another aspect of the invention, a method provides for disabling a line-driver from transmitting false signals after a main power supply is disabled. The method provides for coupling a floating substrate node to a local power supply node such that the line-driver is free to transmit signals when the main power supply is active, and detecting a power-off condition where the local power supply node is decoupled from the main power supply. By decoupling the floating substrate node from the local power supply node when the power-off condition is detected, and coupling the floating substrate to a bias signal when the power-off condition is detected, the conduction path through the substrate is disabled and the line-driver is disabled from transmitting false signals. The method may also include coupling an output signal from the line-driver to the floating substrate node when the local power supply node is decoupled from the main power supply.

In accordance with yet another aspect of the invention, an apparatus prevents initialization problems in a local line-driver due to substrate conduction that is caused by a signal from a remote line-driver. The apparatus includes a first switching means couples a floating substrate node in the local line-driver to a local power supply node when active. A detector means detects a power-off operating mode for the local line-driver. A first activation means activates the first switching means when the operating mode is the power-on mode for the local line-driver. A second switching means couples the floating substrate node in the local line-driver to a bias signal node in the local line-driver when active. A second activation means activates the second switching means when the operating mode is the power-off mode such that substrate conduction is eliminated from the floating substrate node to the local power supply node in the local line-driver when operating in the power-off mode. Also, a deactivation means may deactivate the first switching means when local line-driver is operating in a power-on mode. The deactivation means may be arranged to deactivate the first switching means when an output signal node of the local line-driver is driven to a high potential by the remote line-driver. An isolation means is arranged to isolate the floating substrate node in the local line-driver from an output signal node of the local line-driver when the local line-driver is in the power-on operating mode. The first switching means may include the second switching means.

A more complete appreciation of the present invention and its improvements can be obtained by reference to the accompanying drawings, which are briefly summarized below, to the following detail description of presently preferred embodiments of the invention, and to the appended claims.

DETAILED DESCRIPTION OF THE PREFERRED EMBODIMENT

As will become apparent from the discussion and figures that are described below, the present invention provides for a power-off protection circuit for a LVDS line-driver circuit. The present invention prevents an LVDS driver from being improperly initialized by ensuring proper power-down of the LVDS driver when the power associated with the particular LVDS driver is shut off. By ensuring the proper power-down of the LVDS drive, false data signals associated with the particular LVDS driver are prevented.

Figure 1:
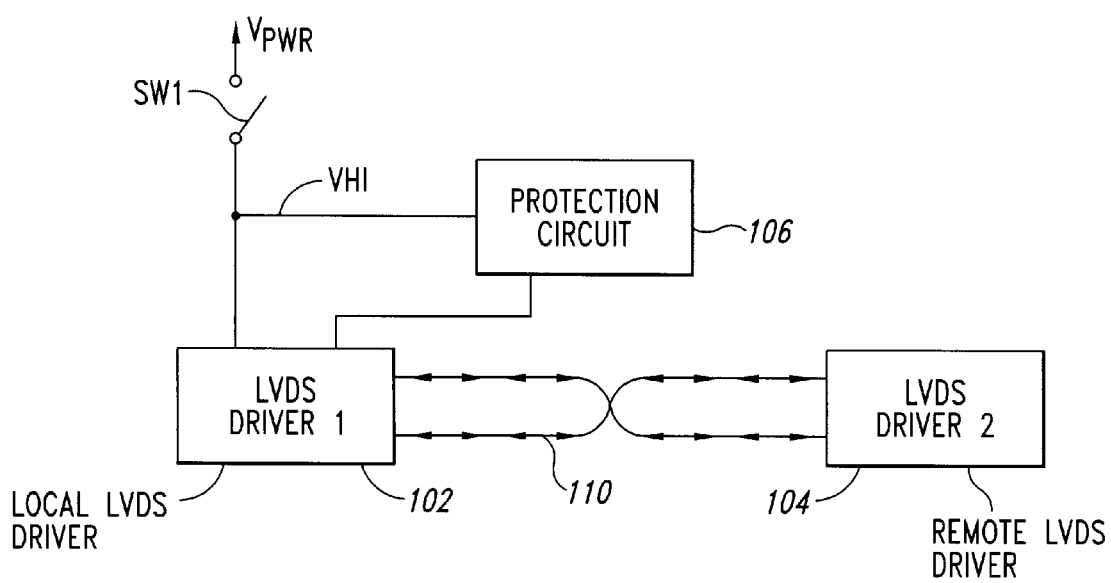
FIG. 1 shows a schematic diagram of a differential line driver system.

A differential line driver system in accordance with the present invention is shown in FIG. 1. A power supply signal (VPWR) is coupled through a switch (SW1) to provide a local power supply signal (VHI) to a local LVDS driver (102, LVDS DRIVER 1). A remote LVDS driver (104, LVDS DRIVER 2) communicates with the local LVDS driver (102) over a communication channel (110) when the local LVDS driver (102) is active. A protection circuit (106) is coupled to the local LVDS driver (102) to ensure proper shutdown of the local LVDS driver (102) when VHI is decoupled from VPWR by opening the switch (SW1). The protection circuit (106) shares the same power supply signal (VHI) as the local LVDS driver (102).

Figure 2:
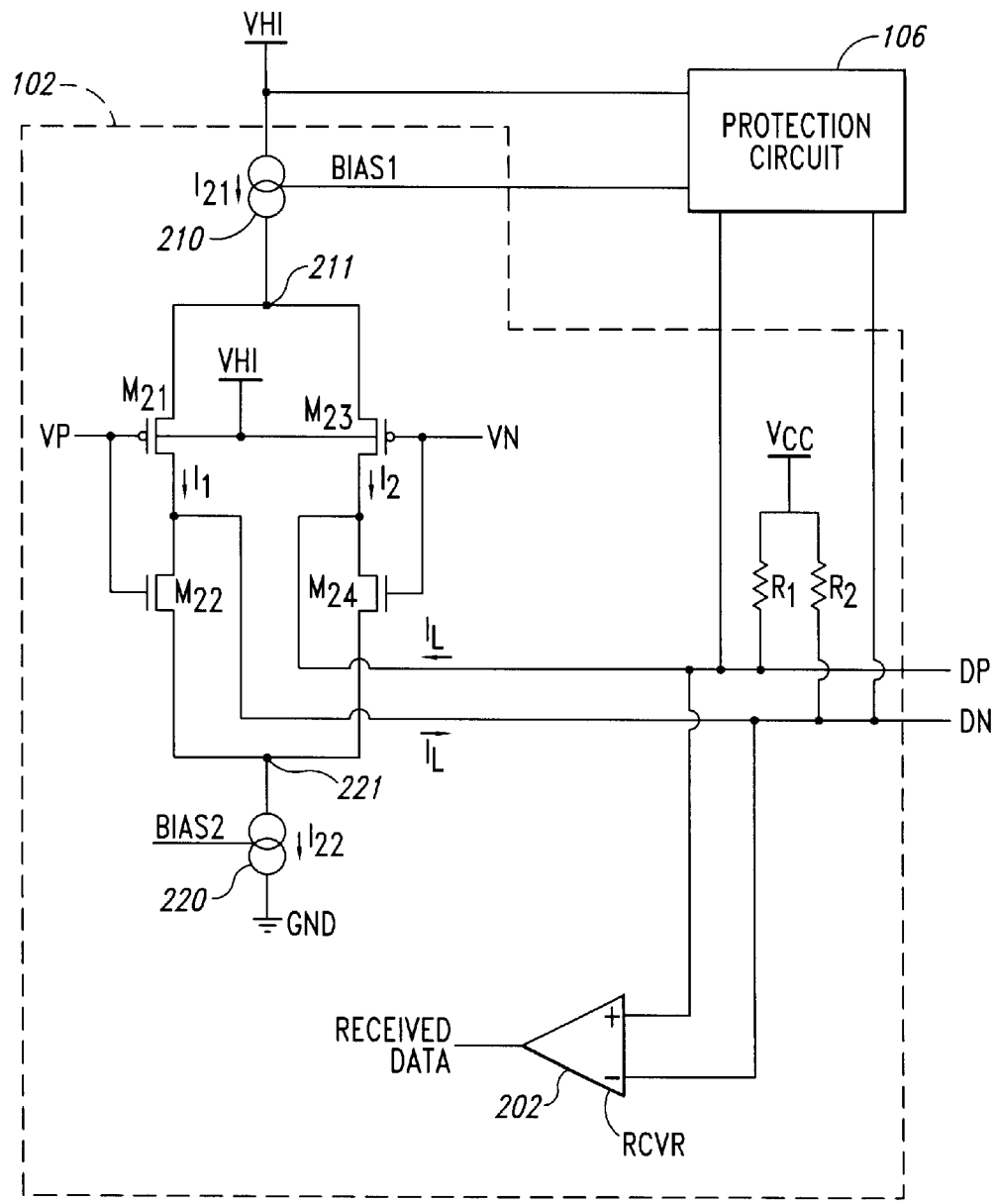
FIG. 2 illustrates a schematic diagram of a LVDS driver including a power-off protection circuit.

A detailed schematic diagram of an exemplary LVDS driver including a power-off protection circuit is shown in FIG. 2. In this example, the local LVDS driver (102) includes four transistors (M21–M24), two current sources (210, 220), a pair of resistors (R1, R2), a data receiver (RCVR, 202), and a protection circuit (106).

The first current source (210) provides a first current (121) from the local power supply (VHI) to a first node (211) in response to the first bias control signal (BIAS 1). The second current source (220) sinks a second current (122) from a second node (221) to a circuit ground (GND) in response to a second bias control signal (BIAS2). The first transistor (M21) has a gate connected to a first data signal (VP), a source connected to the first node (211) and a drain connected to a first output node (DP). The second transistor (M22) has a gate connected to the first data signal (VP), a source connected to the second node (221) and a drain connected to the first output node (DP). The third transistor (M23) has a gate connected to a second data signal (VN), a source connected to the first node (211) and a drain connected to a second output node (DN). The fourth transistor (M24) has a gate connected to the second data signal (VN), a source connected to the second node (221) and a drain connected to the second output node (DN).

The first and second resistors (R1, R2) are connected in series with one another between the output nodes (DP, DN). The common point between the two resistors is connected to another local power supply signal (VCC), which sets up a common mode voltage for a differential signal that appears between the two output nodes (DP, DN). The receiver (RCVR, 202) has an output (RECEIVED DATA) that is responsive to a differential signal that appears across the resistors (R1, R2) at the output nodes (DP, DN).

The protection circuit (106) is connected to the local power supply signal (VHI), the first bias control signal (BIAS 1), and the output nodes (DP, DN). The protection circuit ensures that the local LVDS driver (102) does not provide a false signal when power is disconnected from the local power supply (VHI).

Figure 3:
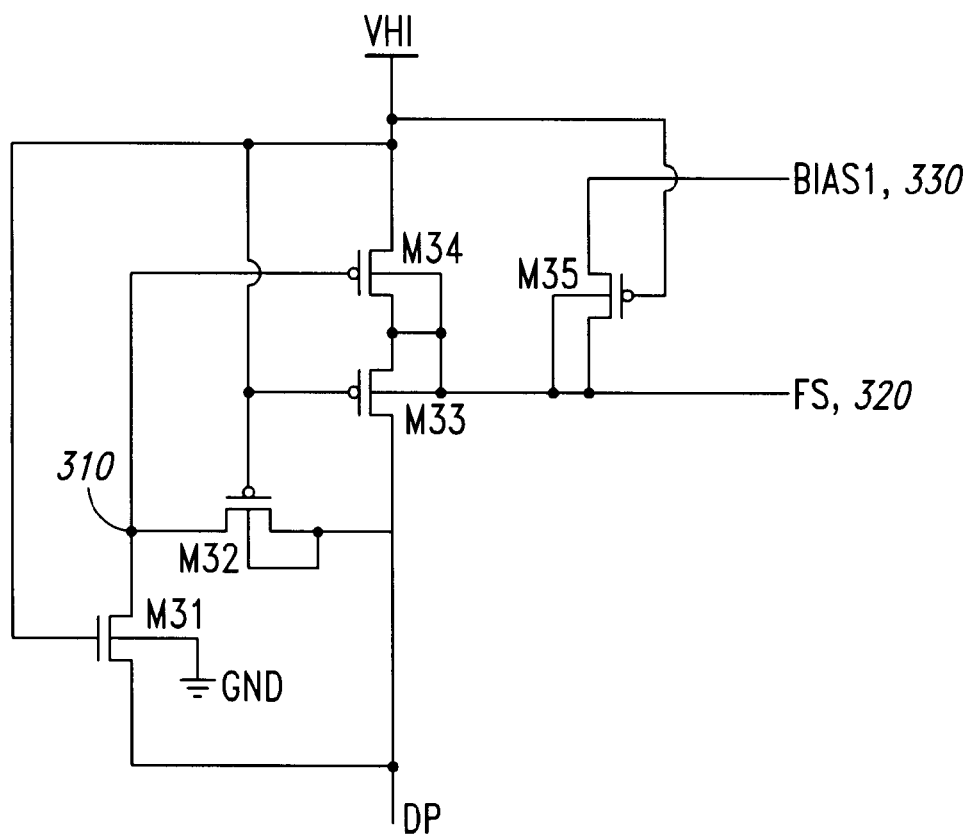
FIG. 3 shows a schematic diagram of a power-off protection circuit.

A detailed schematic diagram of an exemplary protection circuit is shown in FIG. 3. As shown in the figure, the protection circuit includes four PMOS transistors (M32–M35) and one NMOS transistors (M31). The first transistor (M31) has a gate connected to the local power supply (VHI), a source connected to the first output node (DP), a drain connected to a first node (310), and a bulk connected to a circuit ground (GND). The second transistor (M32) has a gate connected to the local power supply (VHI), a source and bulk connected to the first output node (DP), and a drain connected to the first node (310). The third transistor (M33) has a gate connected to the local power supply (VHI), a drain connected to the first output node (DP), and a source and bulk connected to a second node (320, FS). The fourth transistor (M34) has a gate connected to the first node (310), a source connected to the local power supply (VHI), and a drain and bulk connected to the second node (320, FS). The fifth transistor (M35) has a gate connected to the local power supply (VHI), a drain connected to a bias signal (BIAS 1), and a source and bulk connected to the second node (320, FS).

Figure 4:
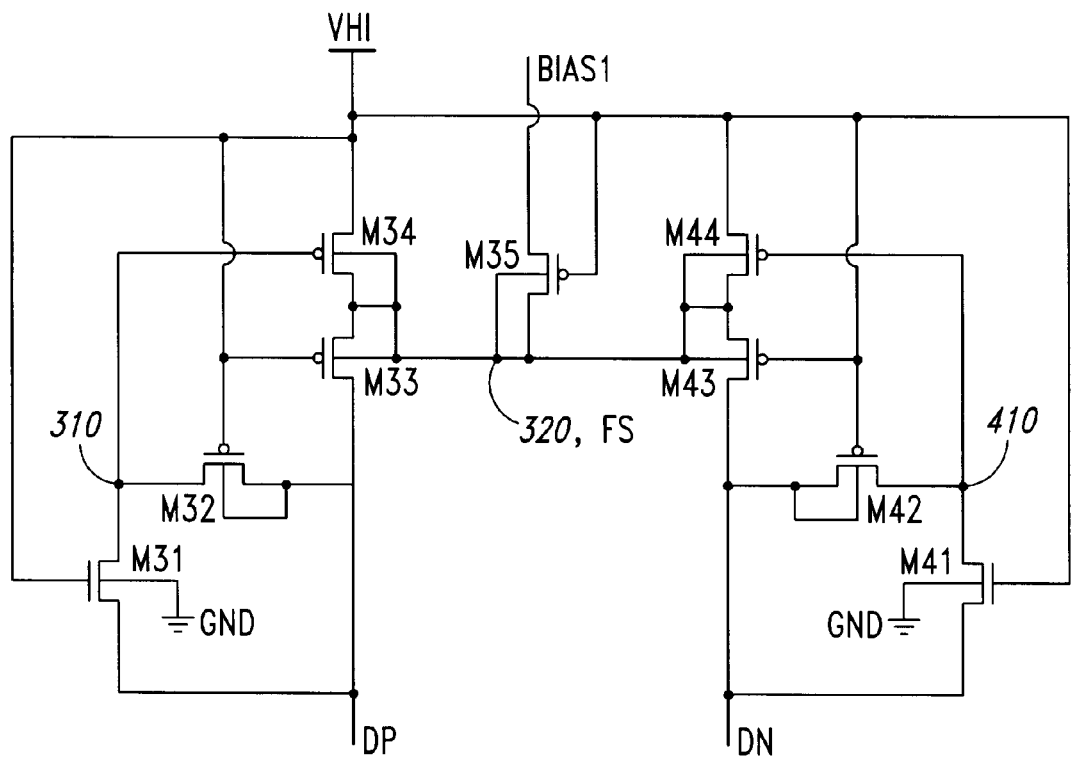
FIG. 4 illustrates a schematic diagram of another power-off protection circuit.

A second exemplary protection circuit is shown in FIG. 4. The second example protection circuit includes two circuits. The first circuit is coupled to the first output node (DP), while the second circuit is coupled to the second output node (DN). The first circuit is the same as the schematic shown in FIG. 3, and the reference designators shown in FIG. 4 are the same as those shown in FIG. 3.

The second circuit includes three PMOS transistors (M42–M44) and one NMOS transistor (M41). The first transistor (M41) has a gate connected to the local power supply (VHI), a source connected to the second output node (DN), a drain connected to a third node (410), and a bulk connected to a circuit ground (GND). The second transistor (M42) has a gate connected to the local power supply (VHI), a source and bulk connected to the second output node (DN), and a drain connected to the third node (410). The third transistor (M43) has a gate connected to the local power supply (VHI), a drain connected to the second output node (DN), and a source and bulk connected to the second node (320, FS). The fourth transistor (M44) has a gate connected to the third node (410), a source connected to the local power supply (VHI), and a drain and bulk connected to the second node (420, FS). The fifth transistor (M45) has a gate connected to the local power supply (VHI), a drain connected to the bias signal (BIAS 1), and a source and bulk connected to the second node (420, FS).

Figure 5:
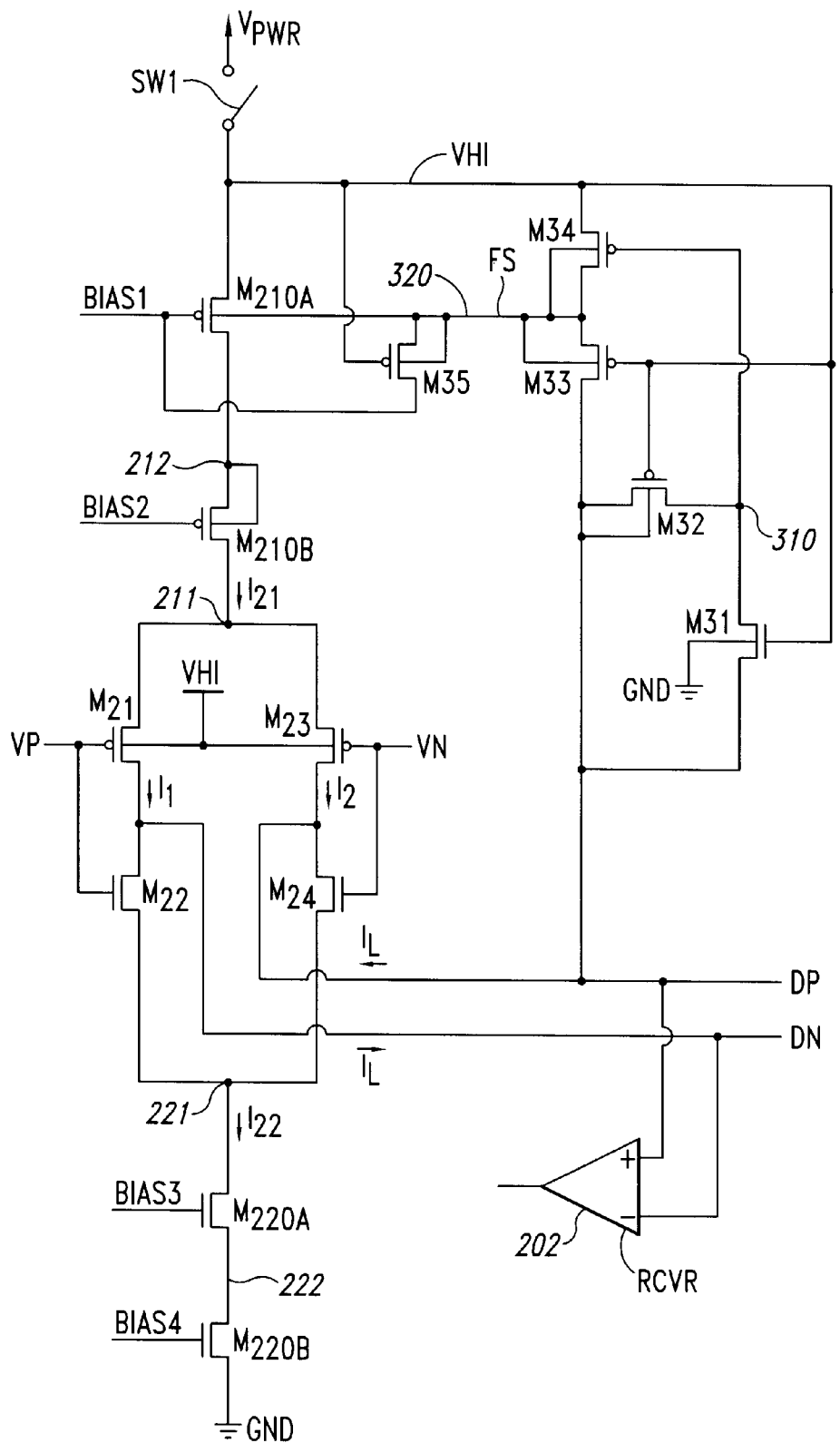
FIG. 5 shows a schematic diagram of one example LVDS driver and power-off protection circuit.

A complete LVDS driver with a protection circuit in accordance with the present invention is shown in FIG. 5. The LVDS driver from FIG. 2 is included with the current sources replaced by transistors (M210A, M210B, M220A, M220B). The first current source is controlled by two bias signals (BIAS1, BIAS2), while the second current source is controlled by another two bias signals (BIAS3, BIAS4). Transistor M210A has a gate connected to BIAS 1, a source connected to the local power supply (VHI), a drain connected to a node (212), and the bulk connected to the floating substrate connection (FS, 320) of the power-off protection circuit shown in FIG. 3. Transistor M210B has a gate connected to BIAS2, a source and bulk connected to node 212, and a drain connected to node 211. Transistor M220A has a gate connected to BIAS3, a. source connected to a node (222), and a drain connected to another node 221. Transistor M2220B has a gate connected to BIAS4, a source connected to a circuit ground (GND) and a drain connected to node 222.

The switch (SW1) may be implemented using any technology as may be reasonable in a particular application. When implemented as transistor switching circuits, control logic (not shown) is used to generate a control signal that opens and close the switching mechanism. As will be appreciated, the switch is a non-ideal switch that has a finite on-resistance in the closed mode, and finite isolation impedance in the open mode.

Power-on Mode

The operation of the above-described circuits will now be described with reference to FIG. 5 operating in a power-on mode. When the operating mode is a power-on mode, the first switch (SWI) is closed, and the local power supply (VHI) is at the same potential as the main power (VPWR).

The differential line-driver shown in FIG. 2 operates by driving a current (IL) through a load (not shown) in response to a differential data input (VP, VN). Transistors M21 and M22 are controlled by data input VP, while transistors M23 and M24 are controlled by data input VN. VP and VN are out of phase with one another such that VP is at a high logic level when VN is at a low logic level. When VP is at a low logic level, a current I1 flows through transistor M21 and to the load as the load current (IL). A current returns from the load through transistor M24. Similarly, when VP is at a high logic level, a current I2 flows through transistor M23 to the load as current IL, and returns from the load through transistor M22. At the remote port (see FIG. 1) the current through the load produces a differential voltage that is converted back into the transmitted differential data.

The protection circuit does not interfere with the operation of the LVDS driver when operating in the power-on mode. The operation of the protection circuit will now be described with reference to the example power-off protection circuit shown in FIG. 3 and configured as shown in FIG. 5.

Transistor M31 is active since the gate is coupled to VHI and the source is coupled to the output node (DP) of the LVDS driver, which is typically less than VHI. The drain of transistor M31 (node 310) pulls the gate of transistor M34 to the potential of the output node (DP). Thus, transistor M34 is activated and pulls the floating substrate connection (FS, 320) to a potential very close to the potential of the local power supply (VHI). Transistor M33 cannot be active since the source and gate of transistor M33 are approximately at the same potentials. Transistors M35 and M32 are also "OFF" since their gate terminals are connected to the local power supply (VHI), which is active in this operating mode.

Power-off Mode

The operation of the above-described circuits will now be described with reference to FIG. 5 operating in a power-off mode. When the operating mode is a power-off mode, the first switch (SW1) is open, and the local power supply (VHI) is isolated from the power supply terminal (VPWR).

The present invention identifies and addresses a problem that occurs when the power is shut off in an LVDS driver as that shown in FIG. 2 and FIG. 5. The substrate of transistors M21 and M23 are connected in common with the VHI terminal. When no power-off protection circuit is employed, a random charge may be present on the gate of transistor M23 (or M21) that may cause transistor M23 (or M21) to provide a conduction path through the substrate to the local power supply (VHI), causing a false power supply. For example, the remote port (LVDS driver 2) shown in FIG. 1 may send a signal to the local port (LVDS driver 1) even though the local port has the power disabled (SW1 is open). The signal sent by the remote port to the local port is a current that causes the voltage on DP (or DN) to rise. Since a charge may be preset on the gate of transistor M23 (or M21), transistor M23 (or M21) begins to conduct from the drain to the substrate (a diode formed in the structure of M23 or M21 to the substrate). Once the conduction path is formed, the potential of the local power supply rises up providing a false power supply to the local port, which was already disabled.

The power-off protection circuit shown in FIGS. 3 and 5 are coupled to the first output node (DP) of the local LVDS driver. When power is disconnected (SW1 open), a static charge remains on the gates of transistors M31, M32, M33 and M35 that corresponds to the potential of the local power supply (VHI) when it is active. When the potential of the DP node is low with respect to the charge stored on the gate of transistor M31, transistor M31 maintains the first node (310) at the same potential as the DP node. Transistor M31 will begin to shut off when the potential of DP approaches the potential stored on the gate of transistor M31. Transistor M32 will turn on as the potential at the DP node increases, resulting in coupling the potential at the DP node to the gate of transistor M34 (node 310). Transistor M34 will shut off as the potential of node 310 increases with an increasing potential at the DP node. Since transistor M33 is still active, the potential of the floating substrate (at node FS, 320) will couple to the potential of the DP node. Since the gate of transistor M35 is charged to the potential of VHI, the increased potential of the floating substrate (FS) activates transistor M35. Transistor M35 creates a short circuit connection between the gate and bulk connections of transistor M210A. The local LVDS driver cannot transmit any false signals since transistor M210A cannot conduct any current when transistor M35 is active and the switch (SW1) is open. A false power supply signal cannot be generated at the VHI node since the bulk and source connections of transistor M210A are disconnected from one another. By shorting the gate to the bulk (substrate) connection of PMOS transistor (M210A), substrate conduction cannot occur and the false power supply signal at the VHI node is avoided.

The VHI node will float down to the circuit ground potential (GND) since nothing is active to maintain the high potential and charge will be drained and/or leak from the gates of transistors M31, M32, M33, and M35. Transistors M32, M33 and M35 are maintained active since their gate potentials are also at the circuit ground potential. Transistor M34 is held off by transistor M32. Transistor M35 is held on by the bias created between the floating substrate (source of M35) and the potential of the local power supply (VHI, gate of M35) that is at the circuit ground potential. Since transistor M210A is held off by transistor M35 being active and switch SW1 being open, the local LVDS driver continues to be disabled from transmitting any signal once the disabled local power supply floats down towards the circuit ground potential.

Another exemplary power-off protection circuit is shown in FIG. 4. Transistors M31–M35 are identical in operation to the discussion above with respect to FIG. 5. Transistors M41–M44 operate in an identical fashion to the discussion with respect to transistors M31–M34, except that the output signal that the circuit is responsive to is the DN signal instead of the DP signal. Either the DP or the DN signal can thus cause the floating substrate (FS, 320) potential to rise and thereby activating transistor M35

The power-off protection circuits shown in FIGS. 3, 4 and 5 provide for a method of stopping conduction through the substrate that causes a false power supply signal that appears as a the local power supply (VHI). In each case, the conduction path between the floating substrate and the local power supply is broken. Since the local LVDS driver cannot transmit false signals without a path to the power supply, the LVDS driver fully disabled.

Figure 6:
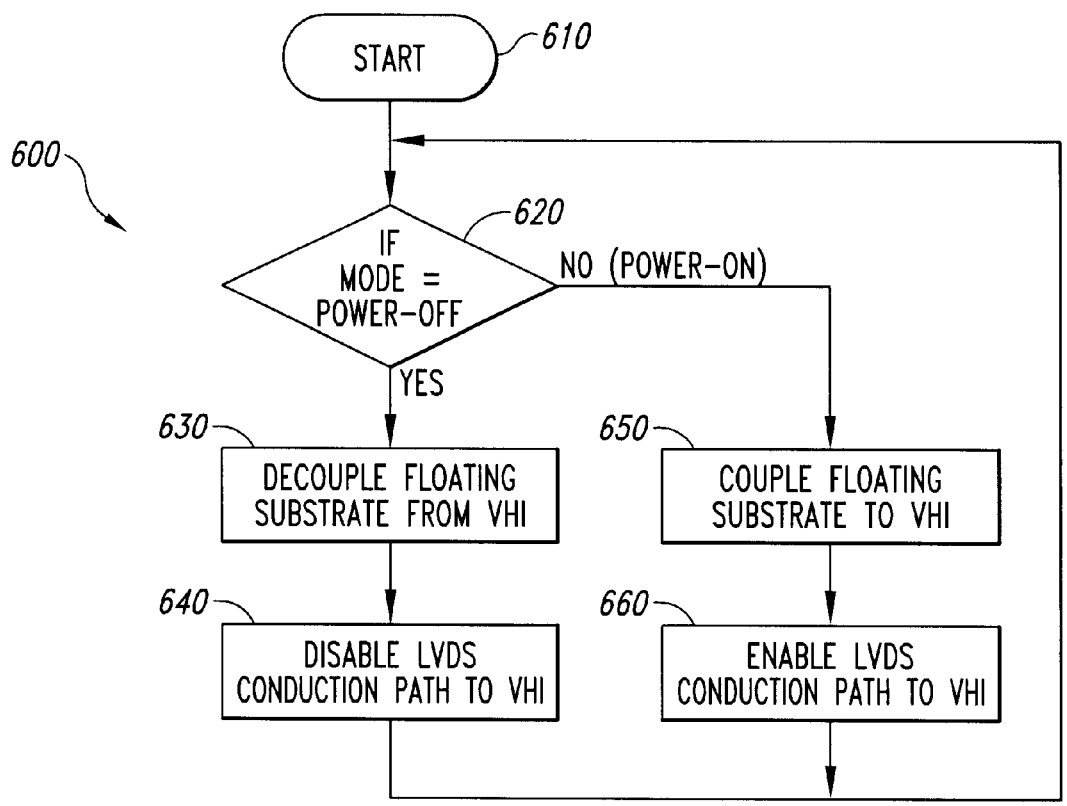
FIG. 6 shows a flow diagram for a protecting the power-off of an LVDS driver.

FIG. 6 shows a flow diagram for a method of protecting the power-off of an LVDS driver. The operation of the method begins at start block 610 and proceeds to decision block 620. At decision block 620, the process determines if the current operating mode is a power-on mode or a power-off mode.

Decision block 620 proceeds to block 630 when the current operating mode is the power-off mode. The floating substrate is decoupled from the local power supply (VHI), in block 630. Proceeding from block 630 to block 640, the conduction path from the local power supply (VHI) to the local LVDS driver is disabled. Processing proceeds back to block 620 from block 640.

Decision block 620 proceeds to block 650 when the current operating mode is the power-on mode. The floating substrate is coupled to the local power supply (VHI) in block 650. Proceeding from block 650 to block 660, the conduction path from the local power supply (VHI) to the local LVDS driver is enabled. Processing proceeds back to block 620 from block 660.

In one embodiment of the invention, an electronic circuit decouples the floating substrate from the local power supply by means of a switching transistor such as transistor M34 shown in FIG. 3. Transistors M31 and M32 are arranged to provide detection of the power-off and power-on modes such that the gate of transistor M34 controls the coupling and decoupling of the floating substrate to the local power supply (VHI). After having read the above described disclosure, it is understood and appreciated that other electronic circuit arrangements may also be adapted to detect the power-on and power-off modes to control a switching mechanism as described above.

In another embodiment of the invention, an electronic circuit provides a conduction path from the local power supply (VHI) to the local LVDS driver by transistor means such as transistors M210A and M35 as shown in FIG. 5. Transistor M210A provides a current source to the LVDS driver when transistor M35 is inactive. When transistor M35 is active, the gate and source terminals of transistor M210A are shorted together and conduction from the local power supply (VHI) to the LVDS driver is disabled. After having read the above described disclosure, it is understood and appreciated that other electronic circuit arrangements may also be adapted to enable and disable conduction from a local power supply to an LVDS driver as described above.

The above specification, examples and data provide a complete description of the manufacture and use of the composition of the invention. Since many embodiments of the invention can be made without departing from the spirit and scope of the invention, the invention resides in the claims hereinafter appended.

I claim:

1. A line-driver with a power-down protector that is active when power is disconnected from the line-driver, comprising:

a local power supply node that is arranged to selectively receive a power supply signal, wherein the line driver is coupled to the local power supply node, the local power supply node operates as a local power supply for the line-driver and the power-down protector when the local power supply is coupled to the power supply signal, and the line-driver and the power-down protector are isolated from the power supply signal when the local power supply is decoupled from the power supply signal;

a switching circuit that is arranged to disable a conduction path from the local power supply to the line-driver when the switching circuit is active; and wherein, the power-down protector comprises a detector circuit that determines when the line-driver is in a power-down mode and activates the switching circuit wherein the conduction path in the line-driver is disconnected from the local power supply such that false signals are disabled from transmission by the line-driver; wherein the switching circuit and the detector circuit are arranged to store static charges such that the switching circuit and the detector circuit are powered by the stored static charges when the local power supply is decoupled from the power supply signal.

2. An apparatus as in claim 1, wherein the line-driver is a low voltage differential signaling driver.

3. An apparatus as in claim 1, further comprising: a first transistor that is coupled to the switching circuit, wherein the first transistor is biased as a current source such that the first transistor provides the conduction path in a power-on mode, and the switching circuit is arranged to disable the first transistor such that the conduction path is disabled in the power-down mode.

4. An apparatus as in claim 3, wherein the first transistor is a field-effect transistor and switching circuit is arranged to couple the gate terminal of the first transistor to the bulk terminal of the first transistor in the power-down mode.

5. An apparatus as in claim 3, wherein the first transistor is a field effect transistor, the gate terminal of the first transistor is coupled to a bias potential, and the switching circuit is arranged to couple the bulk and source terminals of the first transistor together in the power-on mode.

6. An apparatus as in claim 3, wherein the switching circuit includes a second transistor that is arranged to couple the gate terminal and the bulk terminal of the first transistor together when the second transistor is active.

7. An apparatus as in claim 3, wherein the switching circuit includes a third transistor that is arranged to couple the bulk terminal of the first transistor to the local power supply when the third transistor is active.

8. An apparatus as in claim 1, wherein the protection circuit includes the switching circuit and the detector circuit.

9. An apparatus as in claim 1, wherein the detector circuit is coupled to the local power supply node and to an output node that is associated with an output of the line driver, such that the detector circuit is arranged to enable the switching circuit when power is disconnected from the local power supply node.

10. An apparatus as in claim 9, the switching circuit further comprising a third transistor that is arranged to couple the local power supply node to a floating substrate node when the third transistor is active, and the detector circuit further comprising a fourth transistor that is arranged to activate the third transistor when the local power node is coupled to the power supply signal.

11. An apparatus as in claim 9, the switching circuit further comprising a third transistor that is arranged to decouple a floating substrate node from the local power supply node when the third transistor is inactive; and the detector circuit further comprising a fifth transistor that is arranged to deactivate the third transistor when the local power supply node is decoupled from the power supply signal.

12. An apparatus as in claim 10, wherein the line-driver includes a first transistor that is a field effect transistor that is biased as a current source in a power-on mode and disabled in the power-down mode such that the first transistor provides the conduction path from the local power supply node to the line driver when power is coupled to the local power supply node and the floating substrate node is coupled to the bulk terminal of the first transistor.

13. An apparatus as in claim 1, the detector circuit further comprising a sixth transistor that is arranged to couple an output of the line driver to the floating substrate node when active, wherein the sixth transistor is activated when the local power supply node discharges towards a circuit ground and the local power supply is decoupled from the power supply signal.

14. A method for disabling a line-driver from transmitting false signals after a main power supply is disabled comprising the steps of:

storing charge at a node when the main power supply is active;

coupling a floating substrate node to a local power supply node such that the line-driver is free to transmit signals when the main power supply is active;

decoupling the floating substrate node from the local power supply node when the main power supply is inactive; and coupling the floating substrate to a bias signal when the power-off condition is detected such that the conduction path through the substrate is disabled and the line-driver is disabled from transmitting false signals.

15. A method as in claim 14, further comprising coupling an output signal from the line-driver to the floating substrate node when the local power supply node is decoupled from the main power supply.

16. An apparatus for preventing initialization problems in a local line-driver due to substrate conduction that is caused by a signal from a remote line-driver, comprising:

a first switching means couples a floating substrate node in the local line-driver to a local power supply node when active;

a detector means that detects a power-off operating mode for the local line-driver;

a first activation means that activates the first switching means when the operating mode is the power-on mode for the local line-driver;

a second switching means that couples the floating substrate node in the local line-driver to a bias signal node in the local line-driver when active; and a second activation means that activates the second switching means when the operating mode is the power-off mode such that substrate conduction is prevented from flowing between the floating substrate node and the local power supply node in the local line-driver when operating in the power-off mode.

17. An apparatus as in claim 16, further comprising a deactivation means that deactivates the first switching means when the local line-driver is operating in a power-off mode.

18. An apparatus as in claim 16, further comprising a deactivation means that is arranged to deactivate the first switching means when an output signal node of the local line-driver is driven to a high potential by the remote line-driver.

19. An apparatus as in claim 16, further comprising an isolation means that is arranged to isolate the floating substrate node in the local line-driver from an output signal node of the local line-driver when the local line-driver is in the power-on operating mode.

20. An apparatus as in claim 16, wherein the first switching means, the second switching means, and the detector means are arranged to operate without power during the power-off operating mode.

* * * * *